(12) United States Patent
Gusat et al.

(10) Patent No.: US 9,471,089 B2
(45) Date of Patent: Oct. 18, 2016

(54) ELECTRONIC CIRCUIT DEVICE WITH ELECTROMAGNETIC CLOCK SIGNAL CONVEYED ALONG COOLING FLUID CONDUIT NETWORK

(71) Applicant: INTERNATIONAL BUSINESS MACHINES CORPORATION, Armonk, NY (US)

(72) Inventors: Mircea Gusat, Langnau a.A (CH); Bruno Michel, Zurich (CH); Thomas E Morf, Gross (CH); Maria Soimu, Langnau (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/082,165

(22) Filed: Mar. 28, 2016

(65) Prior Publication Data
US 2016/0209865 A1    Jul. 21, 2016

Related U.S. Application Data

(63) Continuation of application No. 14/287,268, filed on May 27, 2014, now Pat. No. 9,304,533.

(30) Foreign Application Priority Data

May 28, 2013 (GB) .................................. 1309472.7

(51) Int. Cl.
G06F 1/04 (2006.01)
G06F 1/10 (2006.01)
G06F 1/20 (2006.01)
H05K 7/20 (2006.01)

(52) U.S. Cl.
CPC . G06F 1/10 (2013.01); G06F 1/20 (2013.01); H05K 7/20763 (2013.01)

(58) Field of Classification Search
None
See application file for complete search history.

(56) References Cited

U.S. PATENT DOCUMENTS 3,878,397 A    4/1975  Robb et al.
5,525,190 A *  6/1996  Wojnarowski ... B29D 11/00701
                                             216/23
7,009,842 B2 * 3/2006  Tilton ................. H01L 23/4735
                                             165/80.4

(Continued)

OTHER PUBLICATIONS

Sharma et al, Thermofluidics and Energetics of a Manifold Microchannel Heat Sink For Electronics With Recovered Hot Water as Working Fluid, International Journal of Heat and Mass Transfer, Mar. 2013, 135-151, vol. 58, Issues 1-2.

(Continued)

*Primary Examiner* — Lincoln Donovan
*Assistant Examiner* — Khareem E Almo
(74) *Attorney, Agent, or Firm* — Mercedes Hobson

(57) ABSTRACT

Electronic circuit device and method for conveying clock signal in an electronic circuit device. The electronic circuit device includes: a cooling fluid conduit network including at least one conduit, wherein the cooling fluid conduit network is configured to convey both a cooling fluid and an electromagnetic signal via the at least one conduit; a clock signal injection unit configured to inject an electromagnetic clock signal at an input location of the cooling fluid conduit network; and a clock signal collection unit configured to collect an electromagnetic clock signal.

20 Claims, 4 Drawing Sheets

(56) References Cited

U.S. PATENT DOCUMENTS

| | | | | |
|---|---|---|---|---|
| 7,236,363 B2* | 6/2007 | Belady | | G06F 1/20 |
| | | | | 361/689 |
| 8,019,187 B1* | 9/2011 | Dutta | | G02B 6/122 |
| | | | | 385/133 |
| 8,174,826 B2* | 5/2012 | El-Essawy | | G06F 1/18 |
| | | | | 165/104.33 |
| 8,305,757 B2 | 11/2012 | Keisling et al. | | |
| 2006/0196651 A1 | 9/2006 | Board et al. | | |
| 2010/0111525 A1 | 5/2010 | Ford | | |
| 2010/0284135 A1* | 11/2010 | Tecchiolli | | G06F 1/1613 |
| | | | | 361/679.03 |
| 2012/0217815 A1* | 8/2012 | Clark | | C02F 1/487 |
| | | | | 307/104 |
| 2014/0355204 A1* | 12/2014 | Gusat | | G06F 1/10 |
| | | | | 361/679.53 |
| 2014/0355983 A1* | 12/2014 | Gusat | | H04B 10/25 |
| | | | | 398/45 |

OTHER PUBLICATIONS

Zimmermann et al., Hot Water Cooled Electronics: Exergy Analysis And Waste Heat Reuse Feasibility, International Journal of Heat and Mass Transfer, Nov. 2012, 6391-6399, vol. 55, Issues 23-24.

* cited by examiner

US 9,471,089 B2

ELECTRONIC CIRCUIT DEVICE WITH ELECTROMAGNETIC CLOCK SIGNAL CONVEYED ALONG COOLING FLUID CONDUIT NETWORK

CROSS-REFERENCE TO RELATED APPLICATION

This application is a continuation of U.S. patent application Ser. No. 14/287,268 filed on May 27, 2014, which claims priority under 35 U.S.C. §119 from United Kingdom Patent Application No. 1309472.7 filed May 28, 2013, the entire contents of which are incorporated herein by reference.

BACKGROUND

The present invention relates to the field of electronic circuit devices (such as computer system components) cooled by a cooling fluid conduit network (i.e., a fluid-cooling pipeline), which otherwise consumes a clock signal (e.g., computer clock signal) in operation. More particularly, the present invention addresses the problem of clock signaling for computer systems (e.g., servers in datacenters) and more generally for electronic circuit devices which consume clock signal in operation.

Current server, datacenter, and High Performance Computing (or HPC) subsystems are composed of tens to hundreds of densely packed blades, assembled per chassis, rack, and point of delivery (PoD, i.e., a container-sized server cluster). Packaging density and PoD sizes are increasing, whence the key role of packaging and cooling integration.

These systems' operation depends on the existence of a single coherent synchronization source, a.k.a the system clock. For instance, SMP servers require synchronous delivery typically across multiple address busses for snoop-coherency. Other examples include BlueGene's hardware support for synchronization primitives and several other upcoming systems wherein "heart beat" messages are used to detect failures and synchronize operations across multiple boards and racks.

Generating, and especially distributing, a clock over distances larger than a few tens of centimeters is challenging to design from the electromagnetic standpoint, requiring additional electrical power for clock regeneration. Currently, the clock is electrically distributed within a board, chassis, rack, and container through copper wires configured in a complex clock tree topology. This requires finely tuned properties in the desired frequency range, which in turn requires substantial tuning, simulation, and area. Also, inside chips, clock tree architectures are used with frequent power-hungry clock regeneration circuits. In addition, the transition from planar 2D CMOS to 3D stacking chip configurations considerably increases the complexity of signaling, starting with the clock distribution.

More generally, recent evolutions in the IO pin density has led to substantially increased wiring/interconnect densities. The increased density has raised new thermal engineering challenges addressed by fluid instead of air cooling. Recent announcements indicate that at least some of the next generation's large systems will be fluid-cooled, using water, oil, and/or other convenient thermal agents (e.g., by immersion).

SUMMARY OF THE INVENTION

An electronic circuit device including: a cooling fluid conduit network including an at least one conduit, wherein said cooling fluid conduit network is configured to convey both a cooling fluid and an electromagnetic signal via said at least one conduit; a clock signal injection unit configured to inject an electromagnetic clock signal at an input location of said cooling fluid conduit network; and a clock signal collection unit configured to collect said electromagnetic clock signal.

A method for conveying a clock signal in an electronic circuit device, the method including: injecting an electromagnetic clock signal at the input location of a cooling fluid conduit network via a clock signal injection unit; collecting said electromagnetic clock signal via a clock signal collection unit; wherein said cooling fluid conduit network is configured to convey both a cooling fluid and an electromagnetic signal via at least one conduit.

DETAILED DESCRIPTION OF THE PREFERRED EMBODIMENT

Figure 1:
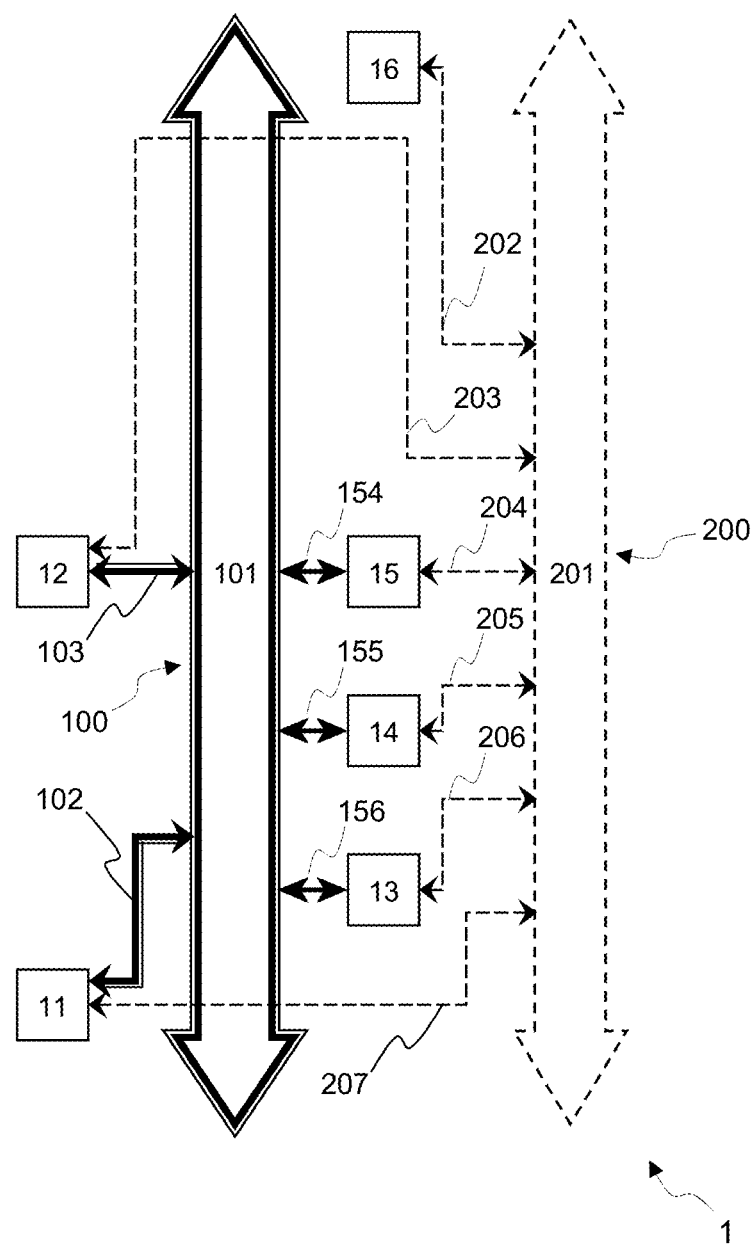
FIG. 1 is a block diagram schematically illustrating components of an electronic circuit device, namely a computer system, wherein a clock signal is conveyed along and via conduits of fluid-cooling conduit network according to embodiments of the present invention.

According to a first aspect of the present invention, the present invention is embodied as an electronic circuit device, including: a cooling fluid conduit network, wherein the cooling conduit network includes at least one conduit adapted for conveying an electromagnetic signal, is arranged in thermal communication with a first set of one or more components of the electronic circuit device, is in signal communication with a second set of one or more components of the electronic circuit device, and is configured to convey both a cooling fluid in the at least one conduit and an electromagnetic signal along and via the at least one conduit. The electronic circuit device also includes a clock signal injection unit configured to inject an electromagnetic clock signal at an input location of the cooling conduit network and a clock signal collection unit configured to collect, at an output location of the cooling conduit network, an electromagnetic clock signal conveyed along and via a conduit of the cooling conduit network for one or more of the components of the second set.

In embodiments of the present invention, the electronic circuit device can further include one or more of the following features: the cooling fluid conduit network can further include at least one junction whereat an upstream conduit of the cooling conduit network splits into at least two downstream conduits of the cooling conduit network in a tree-like manner; at least one signal splitter coupled to split an electromagnetic clock signal from the upstream conduit to the at least two downstream conduits at the junction, whereby the cooling conduit network can serve at least two components of the second set; and at least two clock signal collection units configured to collect clock signal for the at least two components of the second set; and a component of the second set is one of an input/output bridge device, a memory integrated circuit (such as a DRAM, SDRAM, and/or DIMM), and a processor (preferably a central processing unit or CPU).

In embodiments of the present invention, the electronic circuit device can also further include one or more of the following features: the at least one conduit and the clock signal injection unit are designed such that an electromagnetic clock signal injected in the cooling conduit network is propagated in the at least one conduit and the latter behaving as an electromagnetic waveguide or an optical waveguide; the clock signal injection unit includes an electrical clock source; and an electrical-to-waveguide converter and the clock signal collection unit includes a restoration unit coupled to restore an electrical clock signal from an electromagnetic signal conveyed in the cooling conduit network; the restoration unit includes a waveguide-to-electrical converter coupled to an electrical signal restoration unit, preferably via an amplifier; the cooling conduit network includes one or more optical waveguide-like conduits whose inner walls are coated with a layer of optically reflecting material; the cooling conduit network is designed for conveying, and preferably is filled with, an optically clear fluid, the clear fluid preferably including water or clear oil; the cooling conduit network is designed such that a signal attenuation between a signal collected at the output location and a signal injected at the input location of the cooling conduit network, as measured in dB, does not exceed a signal-to-noise threshold as of after collection; the electronic circuit device further includes a heating circuit configured to heat liquid in a given cooling conduit of the cooling conduit network upstream one or more of the components of the second set to a temperature within a predetermined range of temperatures, preferably between 55° C. and 75° C.; and the electronic circuit device further includes a 2D, 2.5D or 3D chip as one of the one or more components of the second set and the cooling conduit network includes at least one conduit arranged on at least one side of the chip.

According to another aspect of the present invention, the invention is embodied as a method for conveying clock signal in an electronic circuit device according to any one of the above described embodiments, the method including: injecting, via the clock signal injection unit, an electromagnetic clock signal at an input location in the cooling conduit network; and collecting, via a clock signal collection unit of the electronic circuit device, an electromagnetic clock signal conveyed in the cooling conduit network.

Preferably, the method can further include: splitting a clock signal at a junction of the cooling conduit network to distribute a clock signal to at least two components of the second set, wherein splitting is preferably carried out at several conduit junctions of the cooling conduit network to enable distribution of a clock signal to several components of the second set in a tree-like manner. Advantageously, the method can further include: amplifying a clock signal, wherein, preferably, amplifying is carried out at a junction of the cooling conduit network and/or at a clock signal collection unit.

In embodiments of the present invention the method can further include: heating a cooling liquid upstream one or more of the components of the second set to a temperature within a predetermined range of temperatures, preferably between 55 and 75° C., and more preferably during a predetermined or limited time.

Preferably, a single clock signal is injected at the step of injecting whose frequency is between 1.0 GHz and 10.0 GHz. Preferably the frequency is between 2.0 GHz and 6.0 GHz. Devices, systems, and methods embodying the present invention are described by way of non-limiting examples and in reference to the accompanying drawings. Technical features depicted in the drawings are not necessarily to scale. The following description is structured as follows. First, general embodiments and high-level variants are described (Section 1). The next section addresses more specific embodiments and technical implementation details (Section 2 and 3).

1. General Embodiments and High-Level Variants

As a variant to immersion, cooling solutions relying on internal in-pipeline circulation schemes are considered here. In-pipeline circulation cooling can use a relatively large copper conduit (also referred to as "plumbing" and in "ring of trees" topology) for the fluid that is pumped across all the critical/hot components (CPU, GPU, DRAM, 10 Bridge, etc.). Such a cooler includes pipes that guide the coolant onto an electronic circuit device (e.g., a compute board) typically via a single inlet tube from where pipes branch to serve different components with smaller tubes and are collected again to a single outlet tube. The tubes are built such that they connect heat dissipating and data generating/consuming components to the cooling loop. Immersion and in-pipeline cooling schemes involve a number of different technical considerations (e.g., concerning the cooling liquid, fluid volumes, debit/circulation intensity, its optimal working temperature, direct access to the silicon die (in-pipe), or indirectly thru the package, cooling efficiency, etc.).

Now, one can realize that such components are the same silicon components requiring precise clock distribution. Having realized this, the present inventors explored the following question: Can the same cooling conduit be re-used for clock distribution? Their answer is positive. A main idea underlying the present invention is to distribute a clock signal along and via a cooling fluid conduit network, e.g., having a tree-like topology, used as conduit for the signal propagation. This solution turns out to be suited not only for applications to large systems as evoked in the introduction, but more generally for any in-conduit fluid-cooled electronic circuit devices or systems.

Accordingly, and in reference to FIGS. 1 to 4C, a general aspect of the present invention concerns an electronic circuit device 1, such as a computer system, a chip thereof, a module, a board, or a rack of a computer system. Broadly, the electronic circuit device 1 includes a cooling fluid conduit network 100, which is configured to convey electromagnetic clock signal along and via the cooling conduits.

In more detail, the cooling fluid conduit network 100 (FIG. 1) includes at least one, but typically more conduits or conduit segments 101-103. These conduits allow for conveying a cooling fluid 50, such as for the network 100 to be in thermal communication with a first set of components 11-15 of the device 1. In addition, at least some of these conduits are further designed for conveying an electromagnetic signal 70, whereby the network can be put in signal communication with a second set of one or more components 11-12 of the electronic circuit device. Also provided are: a clock signal injection unit 10, configured for injecting an electromagnetic clock signal 70 at some appropriate input location of the network 100; as well as one or more clock signal collection units 30, each configured to collect an electromagnetic clock signal conveyed along and via the conduits 101, 102, 103 of the network 100. The collection units 30 are located at appropriate output locations of the networks to enable delivery of the clock signal to requesting components 11, 12.

Thus, with the above solution, cooling conduits can be re-used also for clock distribution. The clock signal can be conveyed without extra space needed and without (or with little) additional infrastructure.

The first set of components 13-15 can include: an input/output (I/O) bridge device, a network interface, a storage controller, a memory integrated circuit such as a DRAM, SDRAM, FLASH, DIMM, and a processor, preferably a central processing unit or CPU, or a graphical processor unit or GPU, or any accelerator, and more generally any computer chip or the like, i.e., any computer component that needs to be cooled down (e.g., that consumes power), in operation.

The second set of components 11, 12 can include the same types of components. Also, the second set of components 11, 12 can more generally include any computer component that consumes clock signal, that is, requires clock signal for performing operations or storing, or providing data dependent on such clock signal, and which therefore needs to be fed with such clock signal. The first and second sets shall typically at least partly overlap, the second set of components 11, 12 typically being a subset of the first set 11-15, as illustrated in FIG. 1.

"Signal communication" and "Along and via the conduits" altogether means that the network is configured, i.e., includes elements that make it possible to convey signal to components 11, 12 of the device 1. In the present context, this signal is conveyed along and via cooling conduit(s).

There are several possible manners of conveying an electromagnetic signal through conduits, which, as the skilled person can acknowledge, can be contemplated for implementing the present invention. A particularly preferred way, here, is to re-use the cooling conduits to propagate the clock signal in a waveguide manner. Propagation can for instance be electromagnetic (in the sense of Maxwell equations): conduits are configured as electromagnetic waveguides, i.e., inner walls of conduits are electrically conductive and the cooling fluid is a permissive transmission medium. Propagation can also be optical, i.e., the signal 70 is optically reflected within the conduits like in optical fibers. The concepts of optical vs. electromagnetic waveguides are known and clear to those skilled in the art. It is equally clear that the signal itself remains electromagnetic in nature, be it optically reflected in optical waveguide-like conduits or electromagnetically propagated in electromagnetic waveguide-like conduits. This signal is thus referred to as an electromagnetic signal. This is discussed in detail later.

In other variants, the conduits can be provided with some optical transmission medium, integral with the conduits. For example, the conduits can be covered, externally, with two or more optical layers where an intermediate layer plays the role of a waveguide core. In still other variants, the optical transmission medium is deployed within the conduits. In that case, the optical medium typically includes: fibers, ribbon of fibers, or ribbon flexes. Parts of the optical transmission medium can be secured to conduits or not. The optical medium can be freely deployed within the conduit. These last variants, however, require an additional transmission medium and are more difficult to fabricate, in practice, compared to waveguide-like conduits. On the other hand, they allow for de-correlating the cooling liquid from the optical transmission medium, a thing that requires less tuning in terms of electromagnetic properties of the cooling liquid.

"Thermal communication" means that conduits are configured and arranged so as to make it possible to cool down the device's components, in operation. The cooling can involve any one of, but likely several of conduction, convection, radiation, or more generally, any type of contact or non-contact thermal exchange, which is known per se. "Thermal communication" notably includes the case where portions of the conduits are in direct contact with the components to be cooled.

The cooling conduit network and the component arrangement and/or configuration can, each, be 2D, 2.5D or 3D. The cooling conduit network can extend beyond i.e., is not limited to, the confines of a chip of the device 1, or more generally a module, a board or a rack that it can include.

A usual electrical bus network 200 can typically be provided aside the combined signal distribution and cooling network 100. The electrical bus network 200 can for instance serve components 11, 12 that are otherwise served by the cooling conduit network 100. Other components can be served only by the electrical bus e.g., component 16 in FIG. 1. Still other components (e.g., components 13-15 in FIG. 1) can be served by the electrical bus and by cooling conduits 154-156, which are connected to the network 100 but need not be specifically adapted for conveying an electromagnetic signal as these components 13-15 do not consume clock signal. More generally, various network topologies can be contemplated for the combined network 100, ranging from a single loop cooling conduit shaped such as to serve one or more destinations in the network, to more sophisticated, e.g., tree-like topologies involving junctions, signal splitting, etc.

For instance, FIG. 1 shows a combined network 100 having different types of conduits: the conduits 101-103 enable clock signal distribution and are distinguished by asymmetric double lines, whereas conduits 154-156 are cooling conduits only (single line). The arrangements of both sets of conduits evoke tree-like structures. The subset of conduits 101-103 allows for the network 100 to provide clock signal to components 11, 12 and thus, for both signal and thermal communications with the components 11, 12. The subset 154-156 allows for cooling only the components 13-15, which can be connected to the electrical bus 200 via respective connections 204-206. For completeness, conduits 101-103 and 154-156 are each in fluid communication with one or more outlet conduits (not shown) that close the cooling liquid loop. The cooling liquid is typically injected via conduit 101 (liquid inlet is not shown, assumed to be upstream conduit 101 and possibly external to the device 1).

For instance, components 11, 12 (second set) can each be one of: an input/output I/O bridge device; a memory integrated circuit such as a DRAM, SDRAM, DIMM, etc.; and a processor, preferably a central processing unit or CPU, any 2D chip or more generally any electronic circuit device component that consumes clock signal, in operation. Of particular advantage is to implement the present invention in devices 1 that involve 2.5D or 3D chips to take advantage of the relatively large dimensions of the conduits (i.e., portions of the conduits can be arranged on one or more side of the chip or even be complemented with capillaries to reach into a 3D chip).

Figure 2:
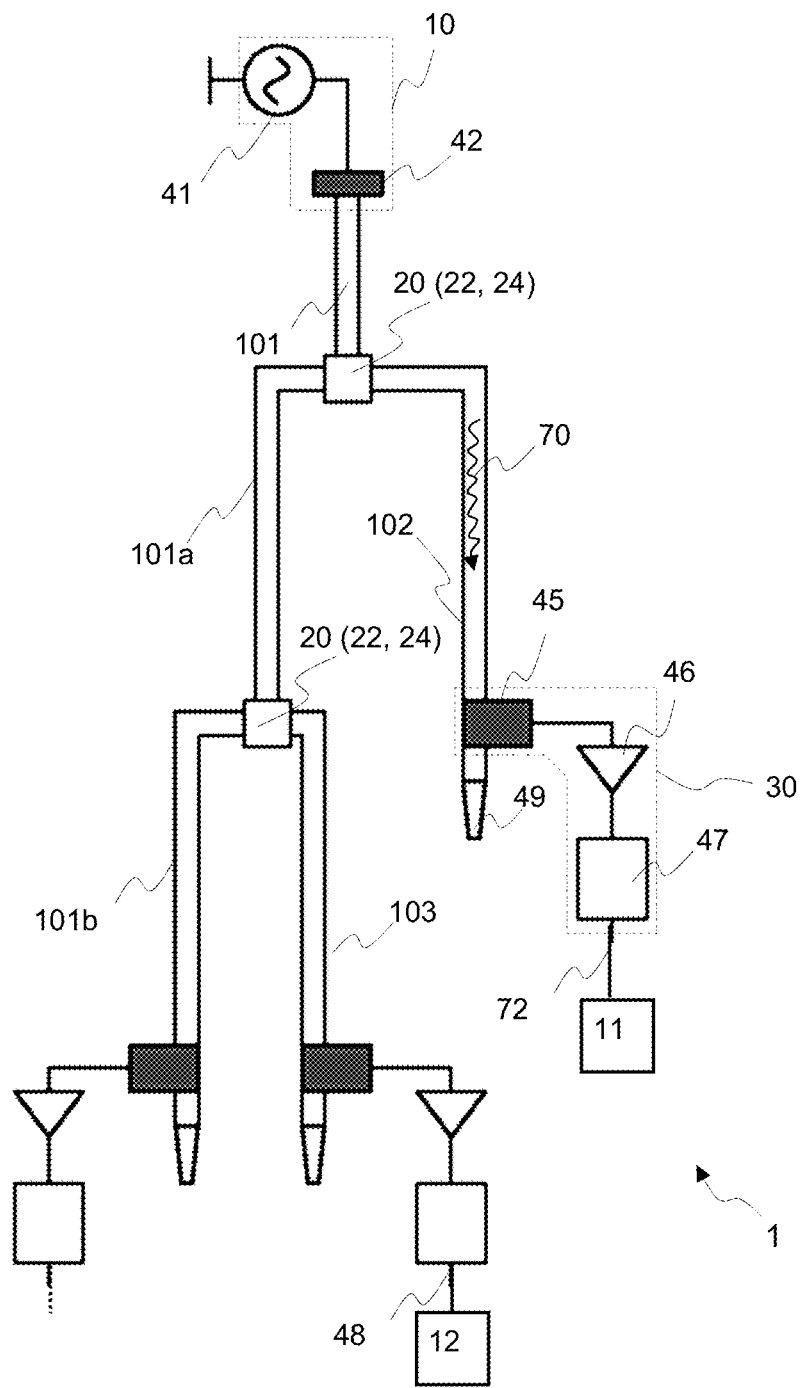
FIG. 2 schematically illustrates components for injecting clock signal in and collecting said signal from cooling conduits of a fluid-cooling conduit network such as illustrated in FIG. 1, as involved in embodiments of the present invention.
Figure 3:
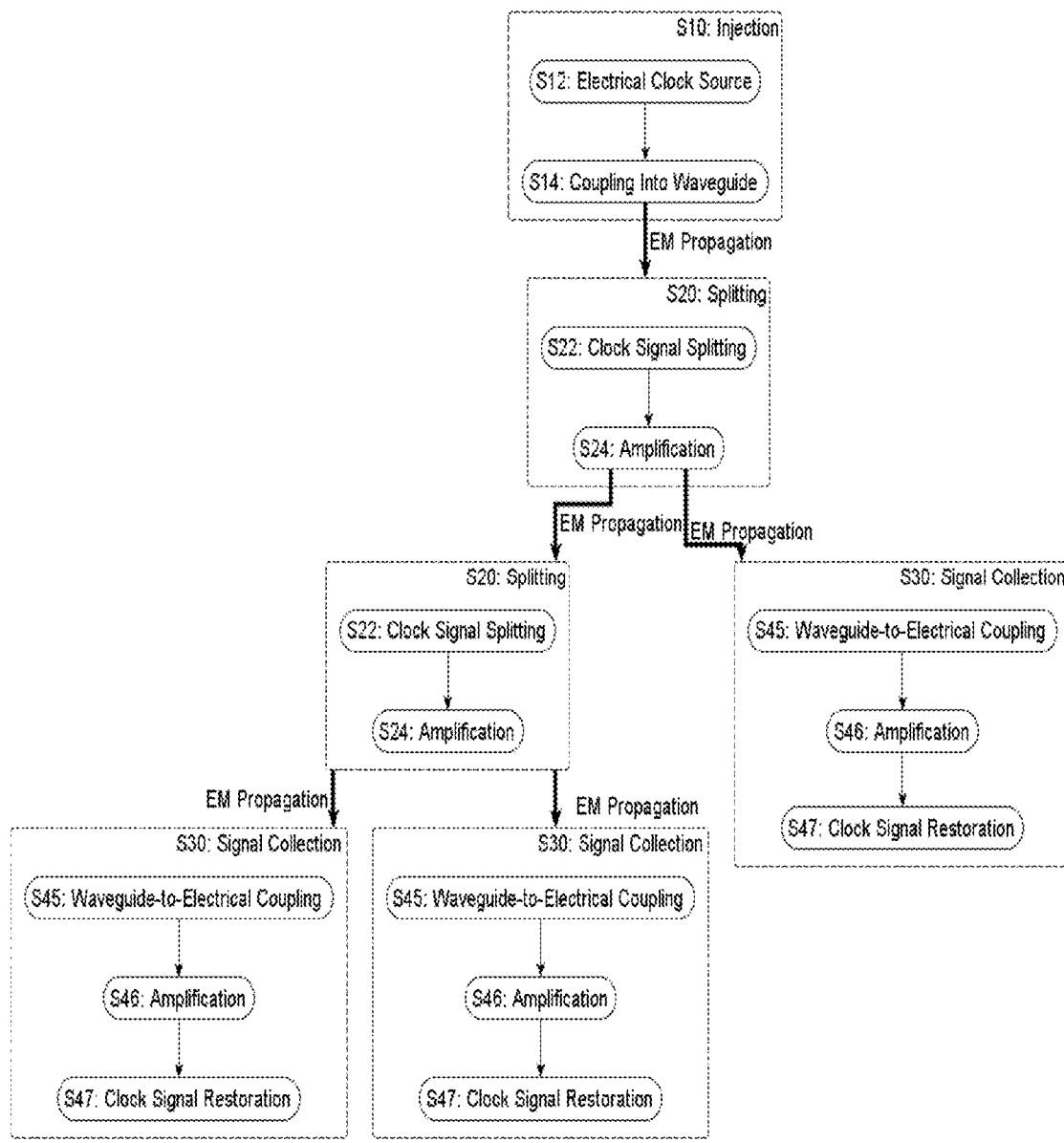
FIG. 3 is a flowchart illustrating high-level steps of a method for conveying a clock signal along components of an electronic circuit device, arranged as in FIG. 3, according to embodiments of the present invention.

Referring now to FIGS. 2 and 3, since typically several destinations in the device 1 can need to be provided with clock signal, embodiments of the above device shall typically include one or more junctions 20. At such a junction, an upstream conduit (e.g., conduit 101 or 101a in FIG. 2) of the network 100 splits into two or more downstream conduits (e.g., conduits 101a, 102 after the first junction 20 or conduits 101b, 103 after the second junction 20 in a tree-like manner). In that case, one or more respective signal splitters 22 (or more generally any kind of router) can be coupled, e.g., at the junctions 20, to split the clock signal from the upstream conduit to the downstream conduits. The cooling conduit network 100 can accordingly serve several components 11, 12 in a tree-like manner. This also makes it possible to map the clock signal distribution (at least partly) to the cooling conduit network, it being noted that the cooling liquid is circulated (closed-loop) whereas the signal distribution involves one-way communication from a source to one or more consumers. Clock signal collection units 30 are provided to correspondingly collect clock signal for the components 11, 12 to be served.

As seen in FIG. 2, the clock signal injection unit 10 can for instance include: an electrical clock signal source 41 (e.g., an analog or preferably a digital clock source); and an electrical-to-waveguide converter 42. Correspondingly, the clock signal collection unit 30 can include: a restoration unit 30, coupled to restore electrical clock signal 72 from the electromagnetic signal 70 conveyed in the cooling conduit network 100. To that aim, the restoration unit 30 can include a waveguide-to-electrical converter 45 coupled to an electrical signal restoration unit 47 (e.g., analog or preferably digital signal restoration unit) and this via an amplifier 46 if needed.

For completeness, FIG. 2 shows: an injection unit 10 designed for injecting electromagnetic clock signal 70 into the conduits or conduit portions (here assumed to be configured as waveguides) 101, 104, 105a-c. To that aim, the injection unit 10 includes: an electrical clock source 41; an electrical-to-waveguide converter 42; multiple conduit junctions 20 and associated signal splitters 22 (or routers) to enable clock distribution here in a tree-like manner. After splitting, the signal 70 can need to be amplified whence the presence of amplifiers 24 at junctions 20; three clock signal collection units 30 each configured to collect electromagnetic clock signal 70 conveyed along and via the conduits 101-103. To that aim, each of the units 30 includes: a waveguide-to-electrical converter 45; an amplifier (post-conversion) 46; and an electrical signal restoration unit 47. Waveguide terminations 49 are provided to prevent undesired interferences. Waveguide termination does not mean that the cooling conduit ends. Only the waveguide ends. On the contrary, the cooling paths continue, i.e., to evacuate heat, as known in in-pipeline liquid-cooled integrated circuit systems and form a closed-loop. In typical applications, the clock tree shall overlay 10 to 50% of the cooling network.

Note that reference 70 denotes the electromagnetic clock signal as conveyed, e.g., propagated in waveguide-like conduits, while reference 72 denotes the electrical clock signal once restored.

Referring now to FIG. 3, and according to another aspect of the present invention, the invention can be embodied as a method for conveying clock signal in an electronic circuit device 1 such as described above and in particular in reference to FIG. 2. Most Basically, This Method Includes:

Step S10: injecting an electromagnetic clock signal 70 via the clock signal injection unit 10 and at an appropriate input location, or root location, in the cooling conduit network 100; and Step S30: collecting electromagnetic clock signal 70 conveyed in the network 100 via a clock signal collection unit 30 of the device 1.

As already evoked earlier, this method can further include: splitting (step S20-22) the electromagnetic clock signal at a junction 20 to distribute clock signal to two or more components 11, 12 of the second set. In tree-like cooling conduit networks, the signal is preferably split at several conduit junctions 20 to enable clock signal distribution in a tree-like manner. If necessary, the clock signal can be (re-) amplified e.g., at a junction 20 (step S24) and/or at a clock signal collection unit 30 (step S34). In practical implementations, the steps of injection/collection can notably be carried out using the same elements as already described in reference to FIG. 2, e.g., elements 41, 42 for injection and elements 45, 46, 47 for collection. As seen in FIG. 3, this leads to corresponding steps S41, S42 (for injection) and S45, S46, S47 (for collection).

Referring now to FIG. 4 and as evoked earlier, a preferred way of conveying electromagnetic signal is to propagate the electromagnetic signal 70 through conduits designed as electromagnetic waveguide (enabling a wide range of frequencies) or optical waveguides (optical frequencies). Thus, depending on the desired frequency, the conduits can be constructed from either electrically conductive or dielectric materials provided that the material chosen still allows for satisfactory thermal exchange with the components of the device 1.

Figure 4A:
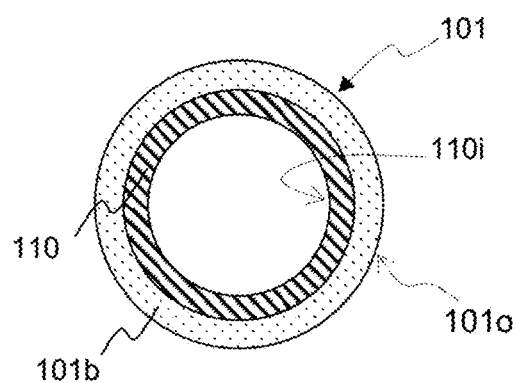
FIGS. 4A-4C schematically illustrate possible cross-sections of a cooling conduit (FIG. 4A), filled with a cooling fluid (FIG. 4B), and enabling a clock signal to propagate therein in a waveguide manner (FIG. 4C), as involved in embodiments of the present invention.
Figure 4B:
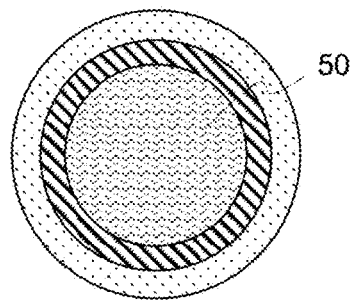
Figure 4C:
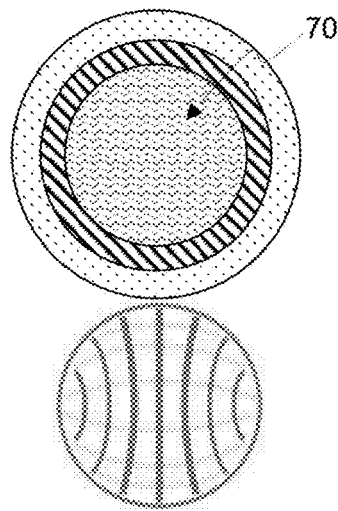

In the first case (electromagnetic waveguide-like propagation), conduits are made of electrically conductive materials such as metals. How the signal propagates in such electromagnetic waveguide-like conduits can be determined and thus designed primarily by solving Maxwell's equations. Broadly, the inner diameter of the conduits shall typically be on the same order of magnitude as the wavelength desired for the guided signal. The dielectric constant of the cooling fluid needs to be considered. A too large dielectric constant can shrink the required diameter. In the present context, where cooling conduits are hollow pipes which typically are in metal and thus electrically conductive, conduits can be used to carry high frequency radio frequency (RF) waves, which are suited for clock signaling. The conduits can for instance be single-piece, e.g., in copper. In variants, such as illustrated in FIGS. 4A-4C, a conduit body 101b can have copper interiors 110. Still, they can be plated with silver or gold on the inside, which are excellent electrical conductors and also resistant to corrosion. FIG. 4C illustrates a $TE_{1,1}$ mode of a circular metallic conduit acting as an electromagnetic waveguide.

In the second case (optical waveguides), the conduits are designed to guide electromagnetic waves by multiple (optical) reflection within the conduits. Conduits can be coated with any suitable optically reflecting material layer 110 for the signal to properly reflect at inner walls 110i (as illustrated in FIGS. 4A-B).

In both cases, the conduits shall be filled with cooling liquid 50, which acts as a transmission medium, in operation. As otherwise implicit from the purpose of the present invention, the cooling liquid 50 can:

(i) on the one hand not prohibitively absorb the electromagnetic signal 70 for the latter to propagate at the chosen wavelength; and (ii) on the other hand still enable cooling.

The conduits' inner walls can further be chemically compatible with the liquid 50 used, e.g., water.

Preferably, a single clock signal is injected (step S10, FIG. 3), i.e., there is only one injection point 10 in the network.

The frequency of the signal is preferably between 1.0 and 10.0 GHz depending on the liquid, dimensions, and frequency chosen (which can need to be optimized). In most cases, however, suitable frequencies shall be between 2.0 and 6.0 GHz. For electromagnetic signal propagation, the radio-frequency (RF) signal injected shall typically be a sine wave. It can be realized that a sine wave is better suited since harmonics of a square wave typically are 3 to 5 times the fundamental frequency, which can cause dispersion in the waveguides. For optical clock distribution, optically pulsed signal, i.e., high power short pulses can be used. The other variants evoked earlier, which involve an explicit additional transmission medium (other than the cooling liquid or the conduits), shall typically provide more flexibility in the type of signal injected, its frequency, etc.

Conduits are typically filled with the cooling liquid 50 at a final stage of the fabrication process. The device 1 is preferably designed for using an optically clear fluid 50, e.g., water or clear oil, to minimize absorption. Now, the cooling liquid can need to be (pre-)heated for optimal performance, e.g., thanks to a dedicated heating circuit with heating elements upstream the served components 11, 12, coupled to a controller or feedback loop circuit to reach a desired temperature or temperature range. Heating circuits are known per se. Heating can be necessary when starting operation of the device 1 and can be carried out during a limited (e.g., predetermined time only) as needed to reach a satisfactory electromagnetic/optical regime.

In addition, in order to maintain reasonable injection power at the clock source, the end-to-end signal attenuation in dB can preferably not exceed the signal/noise threshold at the destination receiver, i.e., taking into account all steps during the signal collection (step S30), e.g., detection and restoration. Thus, the signal attenuation between the output signal and the input signal, as measured in dB, can preferably not exceed the signal-to-noise threshold as measure after signal collection.

Finally, the cooling conduit network can further include a signal injection unit generally configured to inject a data signal in the cooling conduit network (beyond the sole clock signal). Correspondingly, one or more signal collection unit(s) can be provided to collect data signal. The clock signal injection unit 10 can in fact be part of this signal injection unit and, similarly, the clock signal collection unit 30 can form part of a signal collection unit such that any kind of data can be conveyed beyond the sole clock signal.

The above embodiments have been succinctly described in reference to the accompanying drawings and can accommodate a number of variants. Several combinations of the above features can be contemplated. Examples are given in the next section.

2. Specific Embodiments/Technical Implementation Details

Particularly preferred embodiments revolve around the distribution of a single clock signal in a tree-like topology by using water cooling pipelines as conduits for the signal propagation either via electromagnetic waveguides or optically. Namely, it is proposed to:

heat the cooling pipeline for the water to reach an optimal regime (in terms of thermal vs. electromagnetic/optical properties);

inject a clock source into the cooling pipeline at a root location 10 in the network 100;

convey the signal along conduits as an Electromagnetic wave or Optical wave;

split and optionally re-drive the signal at junctions 20 of the network 100;

further convey along the cooling tree branches; until reaching the desired target component (CPU, DRAM, possibly 3D-stacked components), where the signal is extracted and regenerated for local 'consumption.'

A main benefit is in leveraging new types of fluid-based cooling, possibly with direct access (e.g., via capillaries) to inner parts of 3D-stacked components. This avoids an expensive clock network (typically tree-like, that is expensive to design, tune, simulate, drive, etc.) by re-using the cooling 'plumbing' infrastructure. An additional benefit is that the relatively hot water used for cooling enables the reduction of the injected clock power. Indeed, it can be verified that hot water exhibits better electromagnetic properties (less attenuation) than cold water.

While the absorption loss of water increases with frequency, exploitable frequency windows can be determined, e.g., for visible light, as can be concluded from inspection of water spectra, see e.g., http://www.rheinahrcampus.de/Introduction-to-Tissue-Optics.3898.0.html.

Of particular interest is the RF loss vs. temperature, since water absorption is highly temperature dependent, see e.g., dielectric constant and dielectric loss of water versus frequency between 0 and 100° C. (see e.g., http://www.lsbu.ac.uk/water/microwave.html). Dielectric losses decrease significantly if we use warm or even hot water to cool the components. In the present applications, we can assume the 'warm' water to be above 55° C. and the hot water to be below 75° C., it being noted that after thermal exchange with the served components, the temperature typically rises to 80-90° C. Therefore, 60° C. is a pessimistic average temperature. Now, for e.g., a 5 GHz clock frequency ($\lambda \approx 60$ mm in air) and a temperature of 60° C., one obtains a loss coefficient of ~6. On the other hand, a cold start can likely lead to more loss, which can require that the cooling water be pre-heated.

Let assume a clock frequency of 5 GHz: This corresponds to a wavelength of $\lambda \approx 60$ mm in air or approximately $60/\sqrt{65} \approx 7.5$ mm in water. As waveguide, a round cross-section tube/pipe of e.g., 5 mm inner diameter is a reasonable size also for cooling. Now, a waveguide has a specific cut-off frequency below which no wave propagation is possible. With the above tubing dimensions we arrive at a cut-off frequency of ~4.36 GHz, taking the dielectric constant of water into account. Thus, 5 mm conduits can indeed be used. For RF signals, we cannot use arbitrarily large cooling pipes, else higher order modes appear, which travel at different propagation speeds compared to the basic mode. Also, exceedingly large diameter cooling pipes are costly and occupy too much volume. Thus, from a cooling pipeline dimensioning perspective, cooling and electromagnetic wave propagation are compatible, as shown in the above example.

What about attenuation? Assuming for instance a water temperature of 60° degree C., the absorption coefficient at a wavelength of 6 cm (in air) is of ~6 1/cm. This means that in a pipe length of 6 cm the signal drops by ~36%. Thus, although RF absorption of water is substantial in the frequency range usually considered for clock distribution, clock signal distribution is possible. Since the components are typically closed to each other, the signal attenuation is not a critical problem in practice. If necessary though, repeaters and/or multiple parallel injections can be contemplated. Finally, we note that the dielectric constant of water is large due to its polar nature. This lowers the cut-off frequency, which in turn helps to fit lower frequencies in the conduits. All in all, while water is not the ideal dielectric for microwave energy transmission, satisfactory clock signal distribution is nonetheless feasible, subject to some (minimal) optimization.

Alternative cooling fluids with lower dielectric loss can be desirable from an RF point of view. However, cooling properties can be in the same deteriorate, see e.g., http://m.phys.org/news/2012-09-intel-math-oil-dunk-cooler-servers.html. To conclude, beyond water, other cooling fluids like oils can be contemplated. However, a concurrent optimization of the cooling liquid (input) temperature vs. conduit dimensions vs. clock frequency can be needed.

Concerning now the particular case of 3D chip stacking: the cooling fluid can flow between 3D stacked chips, such that one can get access to the chip level when using the fluid as a RF transport medium. The pipes act as waveguides feeding the RF signal down to individual modules in that case. However, RF propagation between the 3D stacked chips shall likely not work anymore; the spacing between the chips being generally too small. Thus, in practice the clock can be brought to several, preferably all, chip edges.

To simplify the clock receiver side, one can operate with higher RF levels. Therefore, little amplification is needed. The RF signal is received by e.g., a waveguide-to-coax coupler at an edge of the chip, followed by a simple amplifier and a Smith trigger circuit, to restore the clock to on-chip signaling level.

Alternatively an optical waveguide-like clock distribution can be implemented. The inner walls of the cooling pipes can be thin-coated with a reflective deposit based on, e.g. Al, Ag compounds. On the clock source side, one can use short, high optical power pulses. Hence a simple photo diode, followed by a small amplifier, can restore the signaling levels on the receiver side. Pure water (or clear fluids) exhibit low optical loss, which is favorable to the present scheme. For copper conduits, copper ions produced during long term operation can increase the loss (yet to a subcritical level only). Now, since such optical waveguide are not traditional optical fibers, but rather rely on optical reflections on the conduit inner walls, slightly more power can be needed for the receiving photo diodes as compared to optical fibers.

Embodiments above address the problem of clock signaling for computer systems, e.g., servers in datacenters, and more generally for electronic circuit devices which consume clock signal. In particular, solutions described above can be applied to the clock distribution in large business analytics appliances (e.g., high-performance data warehouse appliances and advanced analytics applications for uses including enterprise data warehousing, business intelligence, predictive analytics and business continuity planning), cache-coherent non-uniform memory access (NUMA)/symmetric multiprocessing (SMP) servers, and in rack-based high-density datacenter systems.

The integrated circuit devices described above shall typically be distributed by the fabricator in a packaged form, i.e., a chip is mounted in a single chip package (such as a plastic carrier, with leads that are affixed to a motherboard or other higher level carrier) or in a multichip package (such as a ceramic carrier that has either or both surface interconnections or buried interconnections). In any case the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications to advanced computer products.

While the present invention has been described with reference to a limited number of embodiments, variants, and the accompanying drawings, it is understood by those skilled in the art that various changes can be made and equivalents can be substituted without departing from the scope of the present invention. In particular, a feature (device-like or method-like) recited in a given embodiment, variant, or shown in a drawing can be combined with or replace another feature in another embodiment, variant, or drawing, without departing from the scope of the present invention. Various combinations of the features described in respect to any of the above embodiments or variants can accordingly be contemplated, that remain within the scope of the appended claims. In addition, many minor modifications can be made to adapt a particular situation or material to the teachings of the present invention without departing from its scope. Therefore, it is intended that the present invention not be limited to the particular embodiments disclosed, but that the present invention can include all embodiments falling within the scope of the appended claims. In addition, many other variants than explicitly touched above can be contemplated. For example, additional material layers can be provided to coat the conduits, for bonding, and/or (chemical) protection purposes.

What is claimed is:

1. An electronic circuit device, comprising:
   a cooling fluid conduit network comprising an at least one conduit, wherein said cooling fluid conduit network is configured to convey both a cooling fluid and an electromagnetic signal via said at least one conduit;
   a clock signal injection unit configured to inject an electromagnetic clock signal at an input location of said cooling fluid conduit network; and
   a clock signal collection unit configured to collect said electromagnetic clock signal.

2. The electronic circuit device according to claim 1:
   wherein said cooling fluid conduit network is arranged in thermal communication with a first set of one or more components of said electronic circuit device; and
   wherein said cooling fluid conduit network is in signal communication with a second set of one or more components of said electronic circuit device.

3. The electronic circuit device according to claim 2, wherein said cooling fluid conduit network further comprises:
   an at least one junction where an upstream conduit of said cooling conduit network splits into an at least two downstream conduits of said cooling conduit network;
   an at least one signal splitter coupled to split said electromagnetic clock signal from said upstream conduit to said at least two downstream conduits at said at least one junction, wherein said cooling conduit network serves an at least two components of said second set; and
   an at least two clock signal collection units configured to collect said electromagnetic clock signal for said at least two components.

4. The electronic circuit device according to claim 3, wherein a component of said second set is one of:
   an input/output (I/O) bridge device;
   a memory integrated circuit; and
   a processor.

5. The electronic circuit device according to claim 4, where said processor is a central processing unit (CPU).

6. The electronic circuit device according to claim 3, wherein said at least one conduit and said clock signal injection unit are configured such that said electromagnetic clock signal injected into said cooling conduit network is propagated in said at least one conduit and said clock signal injection unit behaves as an electromagnetic waveguide or an optical waveguide.

7. The electronic circuit device according to claim 6, wherein said clock signal injection unit comprises:
an electrical clock source; and
an electrical-to-waveguide converter,
and wherein said clock signal collection unit comprises a restoration unit configured to restore an electrical clock signal from an electromagnetic signal conveyed in said cooling conduit network.

8. The electronic circuit device according to claim 7, wherein said restoration unit comprises a waveguide-to-electrical converter coupled to an electrical signal restoration unit.

9. The electronic circuit device according to claim 8, wherein said cooling conduit network comprises a one or more optical waveguide-like conduits, wherein the inner walls of said one or more optical waveguide-like conduits is coated with a layer of optically reflecting material.

10. The electronic circuit device according to claim 9, wherein said cooling conduit network is configured to convey and is filled with an optically clear fluid.

11. The electronic circuit device according to claim 10, wherein said optically clear fluid is water or clear oil.

12. The electronic circuit device according to claim 10, wherein said cooling conduit network is configured such that a signal attenuation between a signal collected at said output location and a signal injected at said input location does not exceed a signal-to-noise threshold as of after collection.

13. The electronic circuit device according to claim 12, further comprising:
a heating circuit configured to heat liquid in a given cooling conduit of said cooling conduit network upstream one or more of the components of said second set to a temperature within a predetermined range of temperatures.

14. The electronic circuit device according to claim 13, wherein said predetermined range of temperatures is between 55° C. and 75° C.

15. The electronic circuit device according to claim 14, wherein said electronic circuit device further comprises a chip as one of said one or more components of said second set and said cooling conduit network comprises at least one conduit arranged on an at least one side of said chip.

16. A method for conveying a clock signal in an electronic circuit device, the method comprising:
injecting an electromagnetic clock signal at an input location of a cooling fluid conduit network via a clock signal injection unit; and
collecting said electromagnetic clock signal via a clock signal collection unit;
wherein said cooling fluid conduit network is configured to convey both a cooling fluid and an electromagnetic signal via at least one conduit.

17. The method according to claim 16:
wherein said electromagnetic clock signal is conveyed via a conduit of said cooling fluid conduit network;
wherein said cooling fluid conduit network is arranged in thermal communication with a first set of one or more components of said electronic circuit device; and
wherein said cooling fluid conduit network is in signal communication with a second set of one or more components of said electronic circuit device.

18. The method according to claim 17, further comprising:
splitting said clock signal at a junction of said cooling conduit network to distribute said clock signal to an at least two components of said second set to enable distribution of said clock signal to said at least two components in a tree-like manner.

19. The method according to claim 18, further comprising:
amplifying said clock signal, wherein amplifying is carried out at said junction and/or at said clock signal collection unit.

20. The method according to claim 19, further comprising:
heating a cooling liquid upstream one or more of the components of said second set to a temperature within a predetermined range of temperatures during a predetermined time.

* * * * *